US010211109B1

(12) United States Patent
Leobandung

(10) Patent No.: US 10,211,109 B1
(45) Date of Patent: Feb. 19, 2019

(54) LOCAL WIRING IN BETWEEN STACKED DEVICES

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/826,076

(22) Filed: Nov. 29, 2017

(51) Int. Cl.
| H01L 21/8238 | (2006.01) |
| H01L 23/535 | (2006.01) |
| H01L 27/092 | (2006.01) |
| H01L 25/065 | (2006.01) |
| H01L 29/423 | (2006.01) |

(Continued)

(52) U.S. Cl.
CPC ........ *H01L 21/823871* (2013.01); *H01L 21/02603* (2013.01); *H01L 21/02642* (2013.01); *H01L 21/76895* (2013.01); *H01L 21/823418* (2013.01); *H01L 21/823835* (2013.01); *H01L 23/535* (2013.01); *H01L 25/0657* (2013.01); *H01L 27/0928* (2013.01); *H01L 29/4232* (2013.01); *H01L 29/66666* (2013.01); *H01L 29/7827* (2013.01); *H01L 29/78618* (2013.01); *H01L 21/28123* (2013.01); *H01L 21/306* (2013.01)

(58) Field of Classification Search
CPC ........ H01L 21/02603; H01L 29/66666; H01L 29/7827
See application file for complete search history.

(56) References Cited

U.S. PATENT DOCUMENTS

| 7,335,603 B2 | 2/2008 | Mancevski |
| 7,598,544 B2 | 10/2009 | Bertin et al. |

(Continued)

FOREIGN PATENT DOCUMENTS

WO 2011162725 A1 12/2011

OTHER PUBLICATIONS

S. Khasanvis et al., "Architecting Connectivity for Fine-grained 3-D Vertically Integrated Circuits," https://www.umass.edu/nanofabrics/sites/default/files/Arch_Conn_3D_v2-1_apr19.pdf., 6 pages.

(Continued)

*Primary Examiner* — Dung Le
(74) *Attorney, Agent, or Firm* — L. Jeffrey Kelly; Ryan, Mason & Lewis, LLP

(57) ABSTRACT

Semiconductor devices and methods are provided to fabricate field effect transistor (FET) devices having local wiring between the stacked devices. For example, a semiconductor device includes a first FET device on a semiconductor substrate, the FET device comprising a first source/drain layer, and a first gate structure comprising a gate dielectric layer and a metal gate layer. The semiconductor device further includes a second FET device comprising a second source/drain layer, and a second gate structure comprising a gate dielectric layer and a metal gate layer; wherein the first and second FET devices are in a stacked configuration. The semiconductor device further includes one or more conductive vias in communication with either the first gate structure of the first FET device or the second gate structure of the second FET device.

14 Claims, 14 Drawing Sheets

(51) Int. Cl.
*H01L 21/02* (2006.01)
*H01L 21/8234* (2006.01)
*H01L 29/66* (2006.01)
*H01L 29/786* (2006.01)
*H01L 29/78* (2006.01)
*H01L 21/768* (2006.01)
*H01L 21/306* (2006.01)
*H01L 21/28* (2006.01)

(56) References Cited

U.S. PATENT DOCUMENTS

| | | |
|---|---|---|
| 8,878,278 B2 | 11/2014 | Alsmeier et al. |
| 9,054,215 B2 | 6/2015 | Nyhus et al. |
| 9,627,511 B1 * | 4/2017 | Cheng ............... H01L 29/66553 |
| 9,653,563 B2 | 5/2017 | Liaw |
| 2016/0211276 A1 * | 7/2016 | Liu .................... H01L 27/1211 |
| 2017/0005106 A1 | 1/2017 | Zhang |
| 2017/0025412 A1 | 1/2017 | Jun et al. |

OTHER PUBLICATIONS

H.M. Fahad et al., "Are Nanotube Architectures More Advantageous Than Nonowire Architectures for Field Effect Transistors?", Scientific Reports, https://www.nature.com/articles/srep00475, 7 pages.

* cited by examiner

LOCAL WIRING IN BETWEEN STACKED DEVICES

BACKGROUND

This disclosure relates generally to semiconductor fabrication techniques and, in particular, to structures and methods for fabricating stacked field-effect transistor (FET) devices.

In a typical complementary metal-oxide-semiconductor (CMOS) layout, ninety percent of the time a first transistor is connected to at least a second transistor. For example, a drain of an n-type transistor is connected to the drain of a p-type transistor to form an inverter. Other arrangements, such as connections between the drain of a first transistor connected to the source of a second transistor, a drain of a first transistor connected to the drain of a second transistor, or a source of a first transistor connected to the source of a second transistor are also considered, where the first and second transistors may be any combination of n-type or p-type transistors. Hence, stacking transistors one on top of another is attractive in order to reduce the area required to accommodate the multiple transistors. However, with normal planar transistors, stacking is difficult and may involve bonding.

SUMMARY

Embodiments of the invention include structures and methods for forming stacked vertical FET devices having local wiring between the stacked devices.

For example, one exemplary embodiment includes a method for fabricating a semiconductor device, comprising: forming a first field effect transistor (FET) device on a semiconductor substrate, the FET device comprising a first source/drain layer, and a first gate structure comprising a gate dielectric layer and a metal gate layer; forming a second FET device comprising a second source/drain layer, and a second gate structure comprising a gate dielectric layer and a metal gate layer; wherein the first and second FET devices are in a stacked configuration; and forming a conductive via communicative with the first gate structure of the first FET device and the second gate structure of the second FET device.

Another exemplary embodiment includes a semiconductor device which comprises a first FET device on a semiconductor substrate, the FET device comprising a first source/drain layer, and a first gate structure comprising a gate dielectric layer and a metal gate layer. The semiconductor device further comprises a second FET device comprising a second source/drain layer, and a second gate structure comprising a gate dielectric layer and a metal gate layer; wherein the first and second FET devices are in a stacked configuration. The semiconductor device further comprises one or more conductive vias in communication with either the first gate structure of the first FET device or the second gate structure of the second FET device.

These and other features, objects and advantages of the present invention will become apparent from the following detailed description of illustrative embodiments thereof, which is to be read in connection with the accompanying drawings.

DETAILED DESCRIPTION

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

Figure 1:
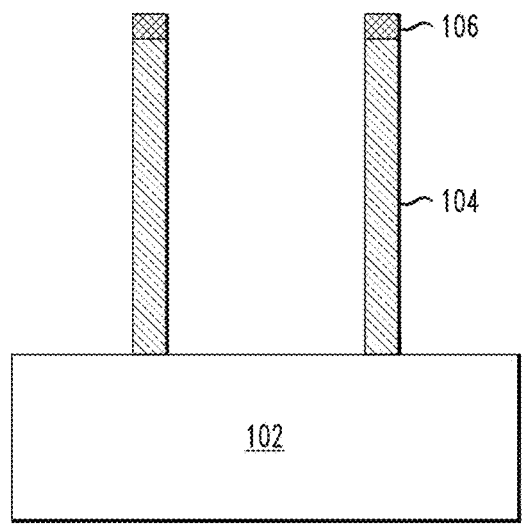
FIG. 1 is a cross-sectional view of a semiconductor device after the formation of a set of nanowires and a hard mask on a semiconductor substrate, in accordance with an embodiment of the present invention.

An illustrative embodiment for forming a semiconductor device will be discussed below with reference to FIGS. 1-21B. Referring now to the figures, FIG. 1 is a cross-sectional view of semiconductor structure 100 illustrating an initial step in forming vertically stacked transistors. The figure illustrates an exemplary semiconductor substrate 102 and a hard mask layer 106 arranged on vertical nanowires 104 of semiconductor substrate 102. Suitable substrate materials include, for example, Si (silicon), strained Si, SiC (silicon carbide), Ge (geranium), SiGe (silicon germanium), SiGeC (silicon-germanium-carbon), Si alloys, Ge alloys, GaAs (gallium arsenide), InAs (indium arsenide), InP (indium phosphide), or any combination thereof.

Hard mask material 106 can be, for example, an oxide or nitride material. Hard mask 106 is deposited using a suitable deposition process such as, for example, chemical vapor deposition (CVD) and remains on the top surface of vertical nanowires 104 after patterning and etching processes (not shown) are completed.

The vertical nanowires 104 have sidewalls that are substantially vertical. Although two vertical nanowires 104 are shown in FIG. 1, the number of vertical nanowires 104 should not be considered limiting. To form the vertical nanowires 104, lithography and etching are performed. Lithography can include forming a photoresist (not shown) on the hard mask layer 106, exposing the photoresist to a desired pattern of radiation, and then developing the exposed photoresist with a resist developer to provide a patterned photoresist on top of the hard mask layer 106. At least one etch is employed to transfer the pattern from the patterned photoresist into hard mask layer 106 and the substrate 102. The etching process may be a dry etch (e.g., reactive ion etching, plasma etching, ion beam etching, or laser ablation). The etching process may be a wet chemical etch (e.g., with potassium hydroxide, or sulfuric acid and hydrogen peroxide). Both dry etching and wet chemical etching processes may be used. After transferring the pattern, the patterned photoresist is removed utilizing resist stripping processes, for example, ashing. Ashing is performed using a suitable reaction gas, for example, $O_2$, $N_2$, $H_2/N_2$, $O_3$, $CF_4$, or any combination thereof.

Figure 2:
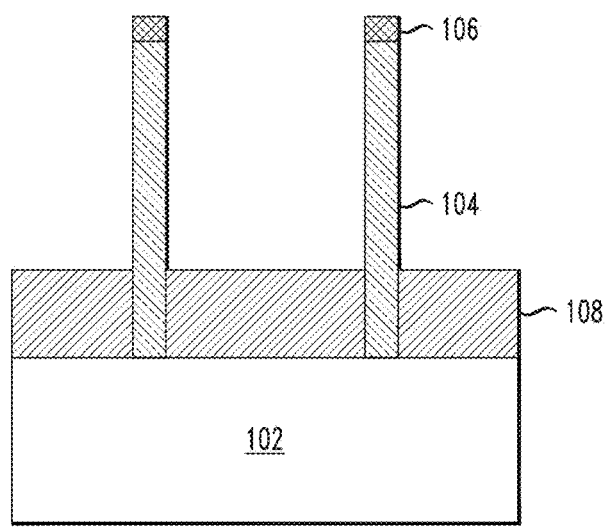
FIG. 2 is a cross-sectional view of the semiconductor device after depositing a shallow trench isolation (STI) insulator, according to an embodiment of the invention.

A next step in forming vertically stacked transistors for semiconductor device 100 is illustrated in FIG. 2 in which a shallow trench isolation (STI) insulator region 108 is formed on substrate 102 and around vertical nanowires 104. As is known in the art, an STI oxide region is used to prevent interaction between adjacent components of a semiconductor device. For example, the STI oxide region may be used to prevent electronic current leakage between the adjacent components of the semiconductor device. The deposited STI insulator region 108 is then planarized and recessed (steps not shown) as illustrated in FIG. 2. Suitable STI insulators include, for example, oxides such as silicon dioxide, tetraethylorthosilicate (TEOS) oxide, or other insulator material. In some embodiments, planarizing includes CMP.

Figure 3:
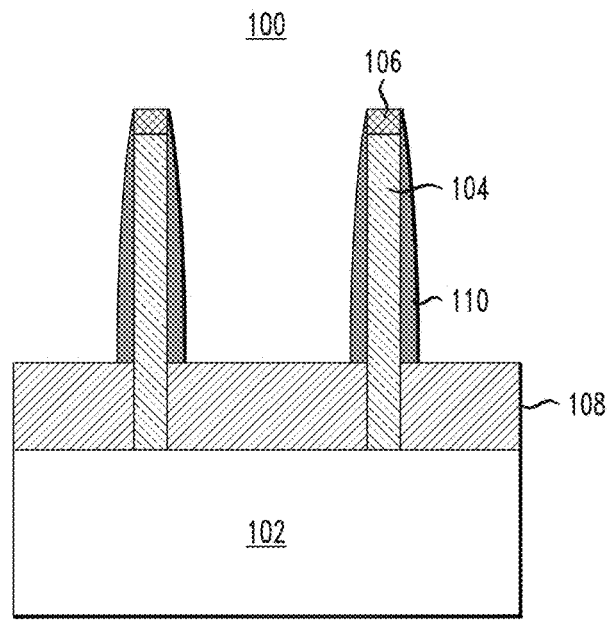
FIG. 3 is a cross-sectional view of the semiconductor device after depositing a first set of spacers, according to an embodiment of the invention.

A next step in forming vertically stacked transistors for semiconductor device 100 is illustrated in FIG. 3 in which spacers 110 are formed on the sidewalls of vertical nanowires 104 and hard mask 106. The spacers 110 can be an insulator spacer material such as a dielectric material, which can be, for example, silicon nitride, silicon oxide, silicon oxynitride, a dielectric metal oxide, a dielectric metal nitride, or a combination thereof. The spacers 110 can be formed, for example, by depositing an insulator spacer material layer, and anisotropically etching the insulator spacer material layer. Horizontal portions of the insulator spacer material layer are removed by the anisotropic etch, and remaining vertical portions of the insulator spacer material layer constitute the spacers 110.

Figure 4:
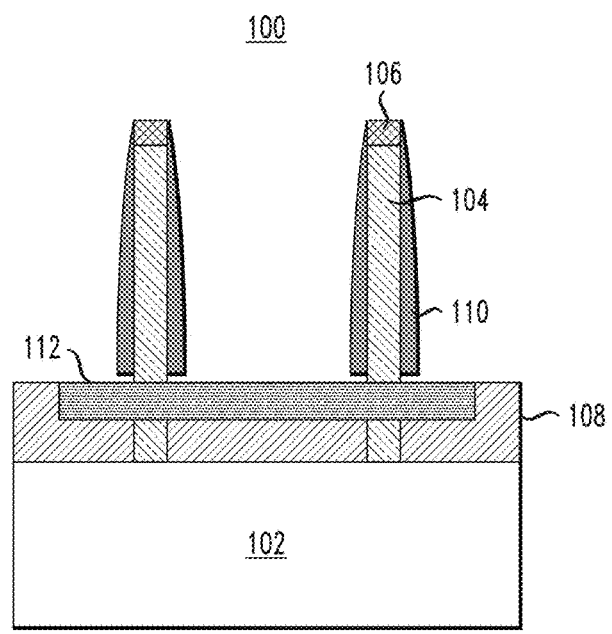
FIG. 4 is a cross-sectional view of the semiconductor device after forming a PFET source region, according to an embodiment of the invention.

A next step in forming vertically stacked transistors is illustrated in FIG. 4 in which portions of STI insulator 108 are recessed which reduces the thickness of STI insulator 108, and exposes a portion of nanowires 104. Portions of the STI insulator 108 may be removed by, for example, an anisotropic etching process such as reactive ion etching or wet etching that selectively removes the STI insulator 108 material. In this exemplary embodiment, a source region 112 is then formed by, for example, growing epitaxial semiconductor material on the exposed surface of STI insulator 108 and on exposed sidewall portions of nanowires 104. The epitaxial growth process is performed to deposit a crystalline layer onto a crystalline substrate beneath. The underlying substrate acts as a seed crystal. Epitaxial layers may be grown from gaseous or liquid precursors. Epitaxial silicon material may be grown using vapor-phase epitaxy (VPE), molecular-beam epitaxy (MBE), liquid-phase epitaxy (LPE), or other suitable process. The type of epitaxial material and dopant used to form the source region 112 will vary depending on whether the FET devices are P-type or N-type devices. Examples of semiconductor materials that may be suitable for the epitaxial growth of the source region 112 include, but are not limited to, silicon (single crystal, polysilicon, or amorphous), germanium (single crystal, polycrystalline, or amorphous), or a combination thereof.

After the semiconductor material is grown, it will be doped with dopant atoms using, for example, in-situ doping or ion implantation or in-situ doping during epitaxy. In this illustrative embodiment, the semiconductor material is doped with a p-type dopant such as, for example, boron, aluminum, gallium, indium, or alloys thereof, to form a PFET source region. In other embodiments as discussed below, the semiconductor material may be doped with a n-type dopant such as, for example, phosphorus, antimony, arsenic, or alloys thereof. After the doping process, the semiconductor material may have dopant a concentration ranging from approximately $1\times10^{19}$ atoms/cm$^3$ to approximately $5\times10^{21}$ atoms/cm$^3$.

As one skilled in the art will appreciate, FIGS. 1-21 illustrate forming vertically stacked transistors for semiconductor device 100 in which the transistor at the bottom of the stack is a PFET transistor and the transistor at the top of the stack is an NFET transistor. However, the invention is not so limited and may include structures in which the transistor at the bottom of the stack and the transistor at the top of the stack may be a PFET and PFET, an NFET and NFET, or a NFET and PFET respectively.

Figure 5:
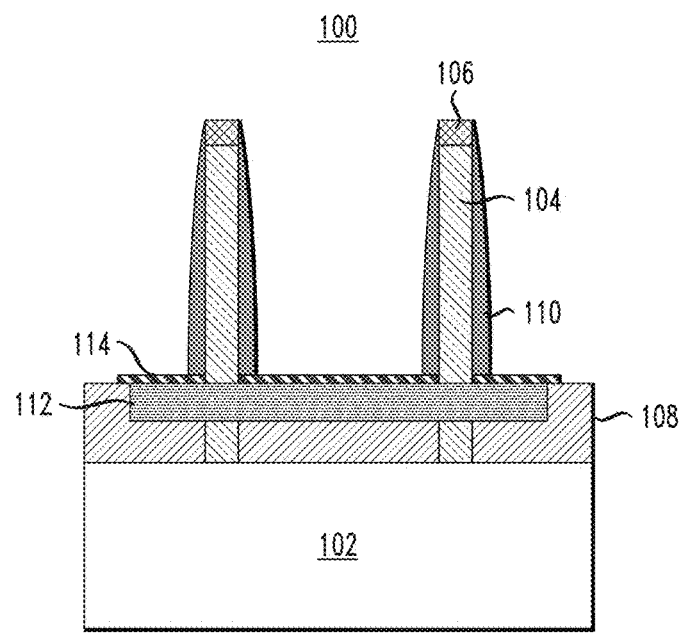
FIG. 5 is a cross-sectional view of the semiconductor device after oxidizing the PFET source region, according to an embodiment of the invention.

A next step in forming vertically stacked transistors for semiconductor device 100 is illustrated in FIG. 5 in which a hard mask 114 is formed by, for example, growing an oxide film on the surface of source region 112 to prevent further epitaxial growth. The oxidized hard mask 114 is formed for example, using a low temperature plasma oxidation process which helps prevent damage to source region 112. In one embodiment, hard mask 114 may be formed by oxidizing source region 112 in an oxygen ambient or by nitridizing in a nitrogen containing ambient.

Figure 6:
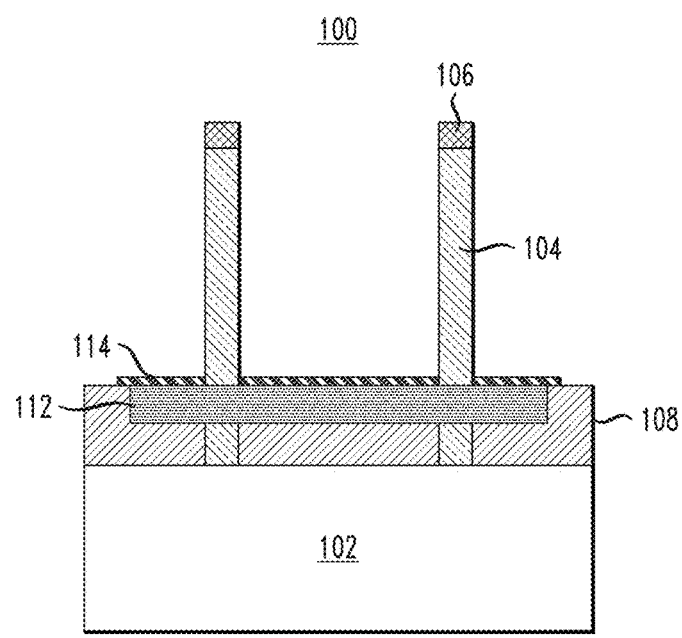
FIG. 6 is a cross-sectional view of the semiconductor device after selectively removing the first set of spacers, according to an embodiment of the invention.

A next step in forming vertically stacked transistors for semiconductor device 100 is illustrated in FIG. 6 in which spacers 110 are removed by; for example, an anisotropic etching process such as reactive ion etching that selectively removes the spacers 110 from semiconductor device 100.

Figure 7:
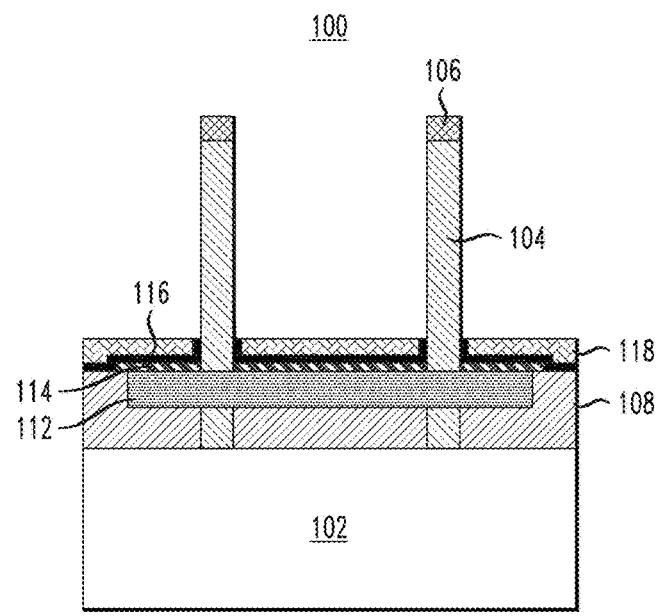
FIG. 7 is a cross-sectional view of the semiconductor device after forming a PFET gate, according to an embodiment of the invention.

A next step in forming vertically stacked transistors for semiconductor device 100 is illustrated in FIG. 7 in which a PFET gate structure is formed by, for example, gate dielectric deposition and gate metal deposition. For example, a gate dielectric layer 116 can be formed along the outer surface, or exterior, of each nanowire 104, and along the top surface of hard mask 114. Gate dielectric layer 116 can be a layer of a high dielectric constant (high-k) material comprising a dielectric metal oxide and having a dielectric constant that is greater than, for example, the dielectric constant of silicon nitride (7.5). The high-k dielectric layer may be formed by methods well known in the art including, for example, chemical vapor deposition (CVD), ALD, molecular beam deposition (MBD), pulsed laser deposition (PLD) and liquid source misted chemical deposition (LSMCD), etc. The dielectric metal oxide comprises a metal and oxygen, and optionally nitrogen and/or silicon. Suitable high-k dielectric materials include, for example, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently established from about 0.5 to about 3.0 and each value of y is independently established from about 0 to about 2.0. The thickness of the high-k dielectric layer may be from about 1 nm to about 10 nm, or from about 1.5 nm to about 3 nm. The high-k dielectric layer can have an effective oxide thickness (EOT) on the order of, or less than, about 1 nm.

The gate metal 118 can be deposited directly on a top surface of the high-k dielectric layer by, for example, CVD, ALD or physical vapor deposition (PVD). Suitable gate metals include, for example, a metal system selected from one or more of TiN, TiC, TaN, TaC, TaSiN, HfN, W, Al and Ru, and may be selected at least in part based on the desired work function (WF) of the device (NFET or PFET), as is known. The metal gate may be recessed within the PFET gate and a gate cap may be deposited upon the recessed metal gate within the PFET gate (not shown).

Figure 8:
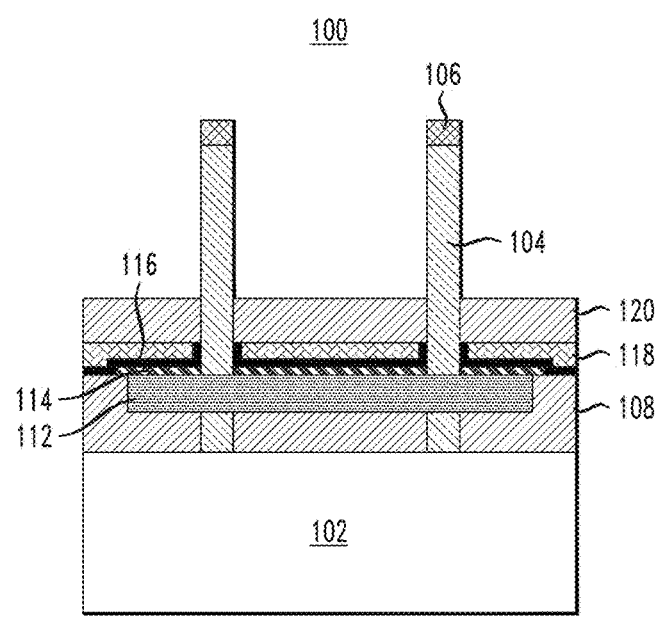
FIG. 8 is a cross-sectional view of the semiconductor device after depositing a first insulator layer, according to an embodiment of the invention.

A next step in forming vertically stacked transistors for semiconductor device 100 is illustrated in FIG. 8 in which a planarized second insulator layer 120 is deposited on the PFET gate. The first insulator layer 120 can be formed using suitable dielectric materials including, for example, silicon oxide, hydrogenated silicon carbon oxide (SiCOH), SiCH, SiCNH, or other types of silicon based low-k dielectrics (e.g., k less than about 4.0), porous dielectrics, or known ULK (ultra-low-k) dielectric materials (with k less than about 2.5). For example, the insulator layer 120 may comprise a single deposited layer of insulating material, or multiple layers of insulating material (e.g., a first layer of a flowable oxide and a second layer of insulating material formed on the first layer). The insulator layer 120 may be deposited using known deposition techniques, such as, for example, ALD, plasma-enhanced chemical vapor deposition (PECVD), PVD, or spin-on deposition.

Figure 9:
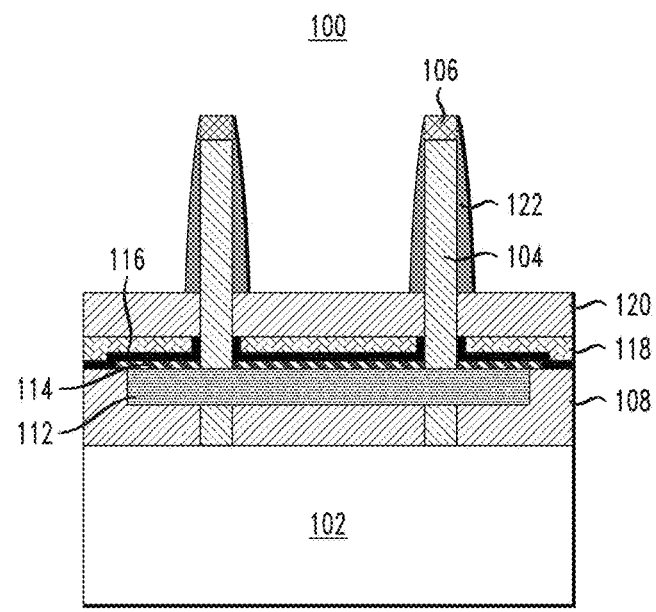
FIG. 9 is a cross-sectional view of the semiconductor device after depositing a second set of spacers, according to an embodiment of the invention.

A next step in forming vertically stacked transistors for semiconductor device 100 is illustrated in FIG. 9 in which spacers 122 are formed on the sidewalls of vertical nanowires 104 and hard mask 106. The spacers 122 can be formed as discussed above with respect to spacers 110 and be of the same or similar insulator spacer material.

Figure 10:
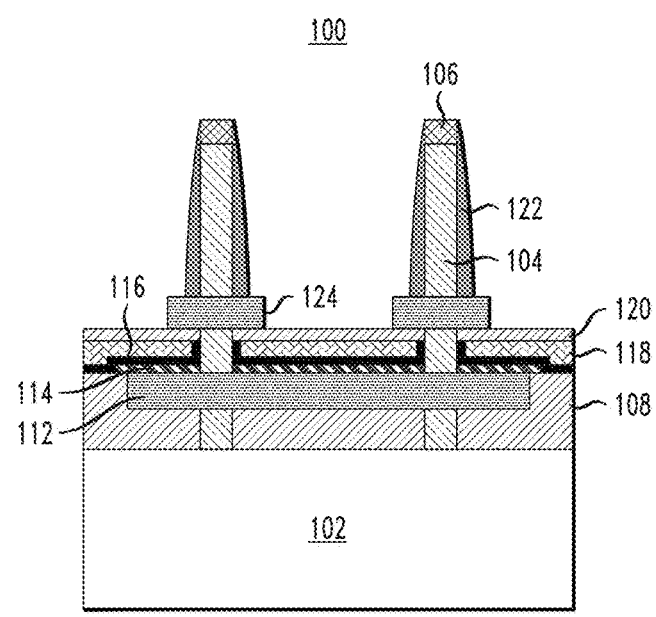
FIG. 10 is a cross-sectional view of the semiconductor device after forming a PFET drain region, according to an embodiment of the invention.

A next step in forming vertically stacked transistors for semiconductor device 100 is illustrated in FIG. 10 in which a drain region 124 is formed on insulator layer 120 and on exposed sidewall portions of nanowires 104. Drain 124 can be formed by, for example, growing epitaxial semiconductor material and then doping the epitaxial layer in a similar manner as source region 112 as discussed above. For example, a semiconductor material suitable for the epitaxial growth of a PFET drain is grown. Next, the epitaxial layer will be doped with a p-type dopant. In other embodiments, the epitaxial layer may be doped with a n-type dopant. Prior to forming the PFET drain 124, insulator layer 120 is first recessed (not shown) to reduce the thickness of insulator layer 120 in a similar manner as with insulator layer 108 discussed above.

Figure 11:
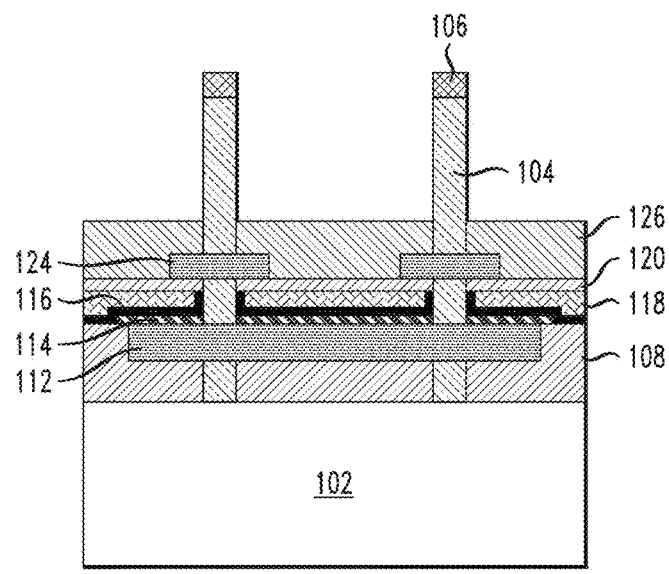
FIG. 11 is a cross-sectional view of the semiconductor device after removing the second set of spacers and depositing a second insulator layer, according to an embodiment of the invention.

FIGS. 11-20A/B illustrate an embodiment for forming the vertical NFET transistor stacked on top of the vertical PFET transistor formed as discussed above. FIG. 11 illustrates first selectively removing spacers 122 from the sidewalls of nanowires 104 and hard mask 106 in a similar manner as spacers 110 discussed above. Next, planarized second insulator layer 126 is deposited on first insulator layer 120, and PFET drain 124. Planarized insulator layer 126 is formed in a similar manner and of similar material as first insulator layer 120 discussed above.

Figure 12:
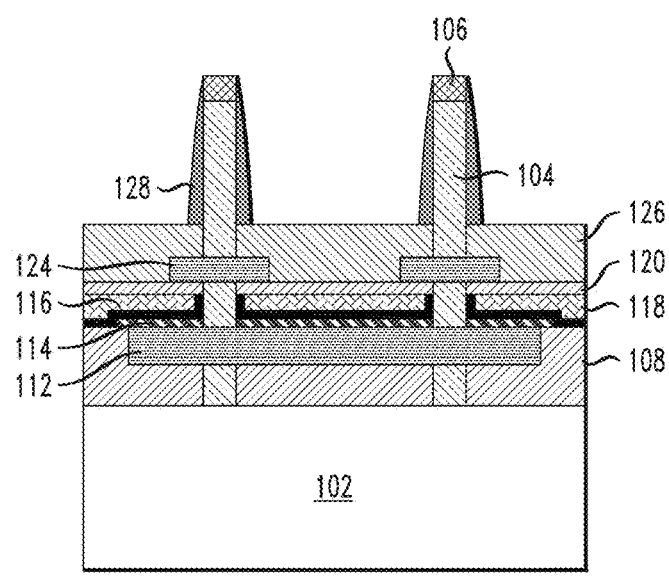
FIG. 12 is a cross-sectional view of the semiconductor device after depositing a third set of spacers, according to an embodiment of the invention.

FIG. 12 illustrates a side view of the next step of forming the top NFET transistor following deposition of spacers 128 on the exposed portions of vertical nanowires 104 and hard mask 106. Spacers 128 can be deposited in a similar manner and be of similar insulator spacer material as spacers 110 and 122 discussed above.

Figure 13:
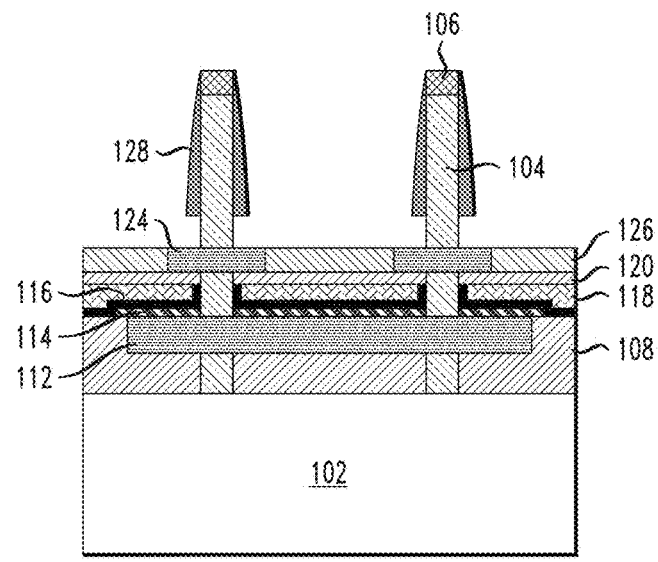
FIG. 13 is a cross-sectional view of the semiconductor device after recessing the second insulator layer, according to an embodiment of the invention.

FIG. 13 illustrates a side view of the next step of forming the top NFET transistor following recessing insulator layer 126 and exposing the top surface of PFET drain 124. Insulator layer 126 is recessed to reduce the thickness of insulator layer 126 in a similar manner as with insulator layers 108 and 120 discussed above.

Figure 14:
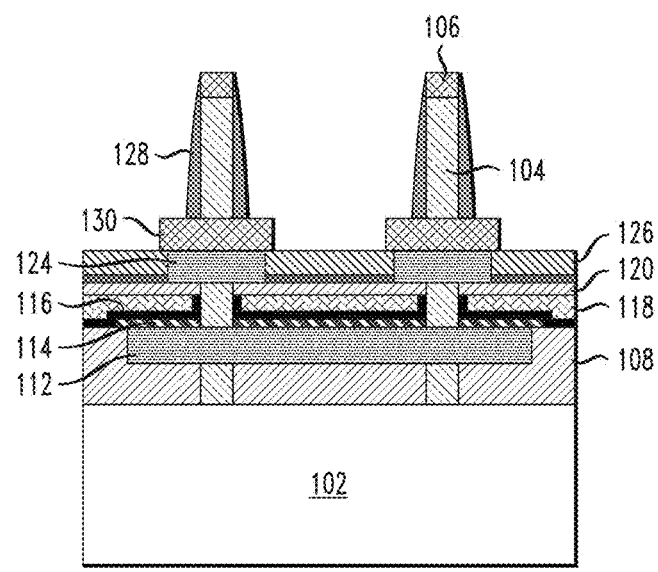
FIG. 14 is a cross-sectional view of the semiconductor device after forming a NFET drain region, according to an embodiment of the invention.

FIG. 14 illustrates a side view of the next step of forming the top NFET transistor following forming the drain region 130. Drain 130 can be formed by, for example, growing a drain epi and then doping the drain epi in a similar manner as drain 124 as discussed above. In this exemplary embodiment, a semiconductor material suitable for the epitaxial growth of an NFET drain is grown. Next, the drain epi will be doped with a n-type dopant as discussed above. In other embodiments, the semiconductor material may be doped with a p-type dopant.

Figure 15A:
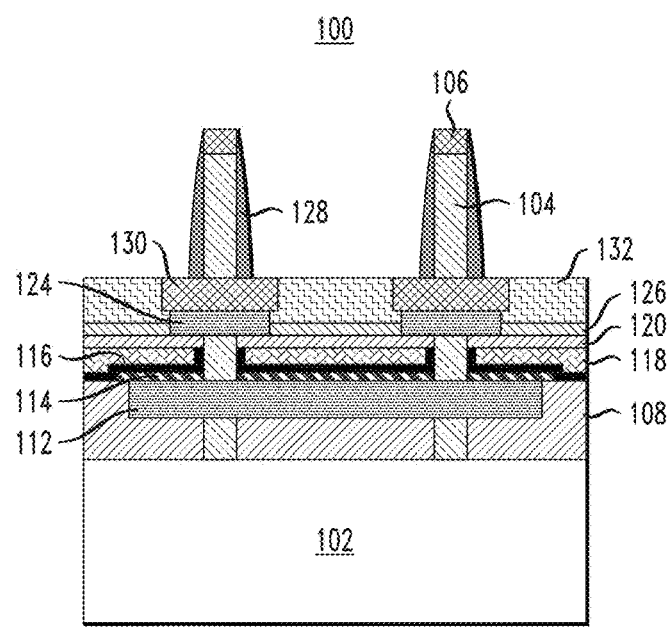
FIGS. 15A and 15B are cross-sectional and top views, respectively, after deposing a first metal layer, according to an embodiment of the invention.
Figure 15B:
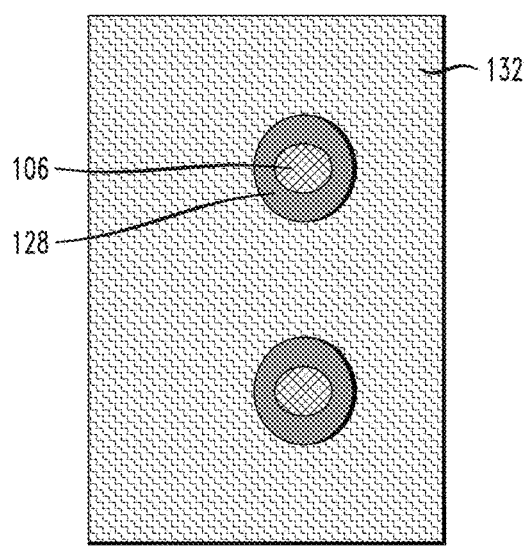

FIGS. 15A and 15B illustrate a cross-sectional view and a top view, respectively, of the next step of forming the top NFET transistor. In this illustrative embodiment, second insulator layer 126 is first recessed to reduce the thickness of second insulator layer 126 in a similar manner as with insulator layers 108 and 120 discussed above. Next, interconnect metal layer 132 is deposited on the top surface of second insulator layer 126 and the exposed sidewalls of drains 124 and 130. Interconnect metal layer 132 is then planarized to a uniform height as the top surface of drain 130. Interconnect metal layer 132 provides the connection to both the p+ drain and the n+ drain of the stacked vertical PFET and NFET devices to other devices or area. Suitable metal for interconnect metal layer 132 may include, for example, W, Ni, Co, Ti, and Pt.

Figure 16A:
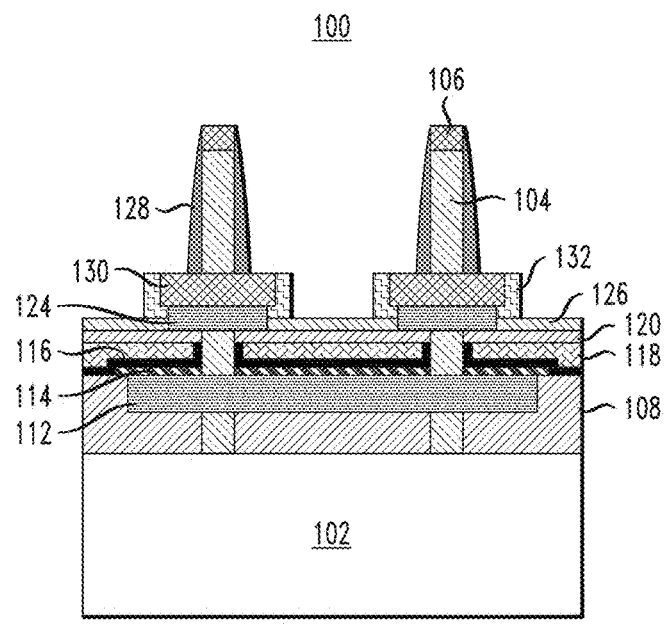
FIGS. 16A and 16B are cross-sectional and top views, respectively, after patterning the metal gate layer, according to an embodiment of the invention.
Figure 16B:
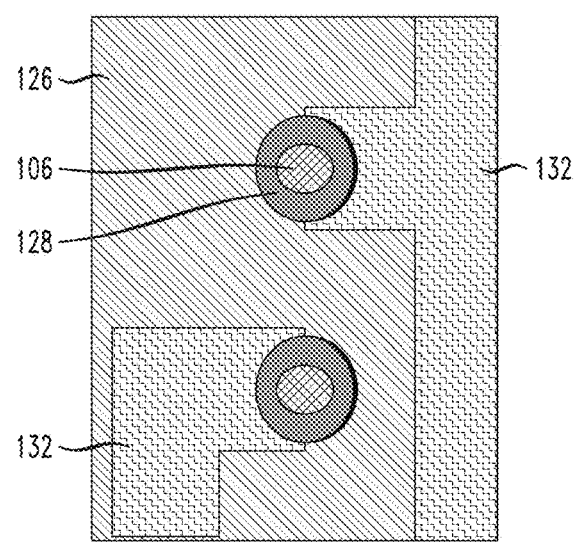

FIGS. 16A and 16B illustrate a cross-sectional view and a top view, respectively, of the next step of forming the top NFET transistor. In this illustrative embodiment, interconnect metal layer 132 is patterned using known lithography and etching as necessary to provide for a local device interconnect as illustrated in FIGS. 16A and 16B.

Figure 17:
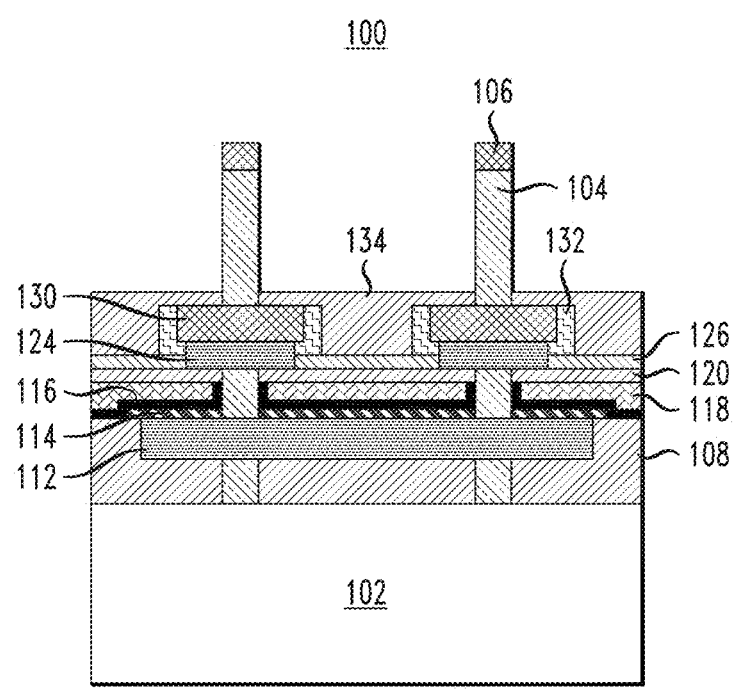
FIG. 17 is a cross-sectional view after depositing a third insulator layer, according to an embodiment of the invention.

FIG. 17 illustrates a cross-sectional view of the next step of forming the top NFET transistor. In this illustrative embodiment, spacers 128 are selectively removed in a similar manner as with spacers 110 and 122 discussed above. Next, a first NFET spacer layer 134 is deposited on second insulator layer 126 and over the top surface of drain 130 and the top and side surfaces of interconnect metal layer 132. Spacer layer 134 is a thin insulating layer, such as for example, an oxide, SiNx, SiBCN, or SiOCN, used to separate drain region 130 from gate metal region that will be deposited on semiconductor structure 100. The spacer layer 134 is then planarized and recessed as necessary.

Figure 18A:
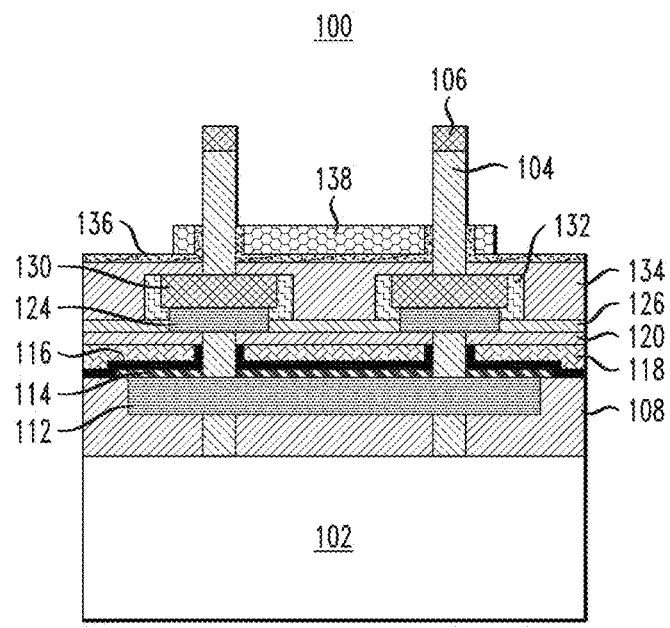
FIGS. 18A and 18B are cross-sectional and top views, respectively, after depositing a second metal layer, according to an embodiment of the invention.
Figure 18B:
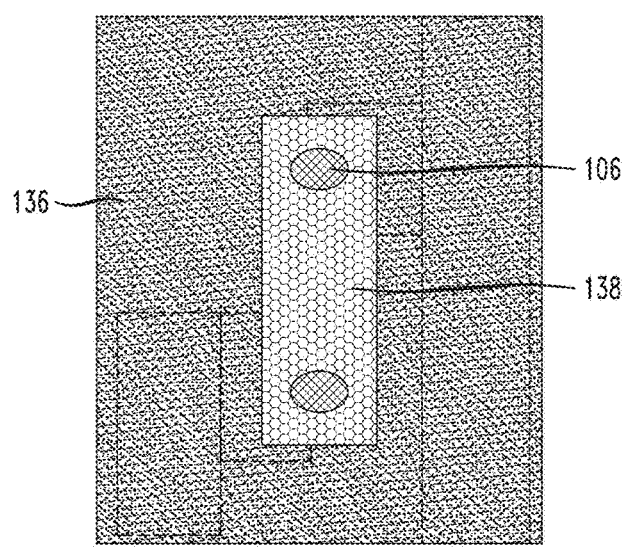

FIGS. 18A and 18B illustrate a cross-sectional view and a top view, respectively, of the next step of forming the top NFET transistor. In this illustrative embodiment, an NFET gate structure is formed by, for example, gate dielectric deposition and gate metal deposition. For example, a gate dielectric layer 136 can be formed along the outer surface, or exterior, of each nanowire 104, and along the top surface of NFET spacer layer 134. Gate dielectric layer 136 can be formed in a same or similar manner and material as gate dielectric layer 116 discussed above. Metal gate layer 138 is then formed on at least a portion of the top surface of gate dielectric layer 136 and on the sidewalls of gate dielectric layer 136 on nanowires 104. Metal gate layer 138 can be formed in a similar manner and of similar material as metal gate layer 118 discussed above. Metal gate layer 138 is then planarized to a height that is uniform with the gate dielectric layer 136 formed on the sidewalls of nanowires 104.

Figure 19A:
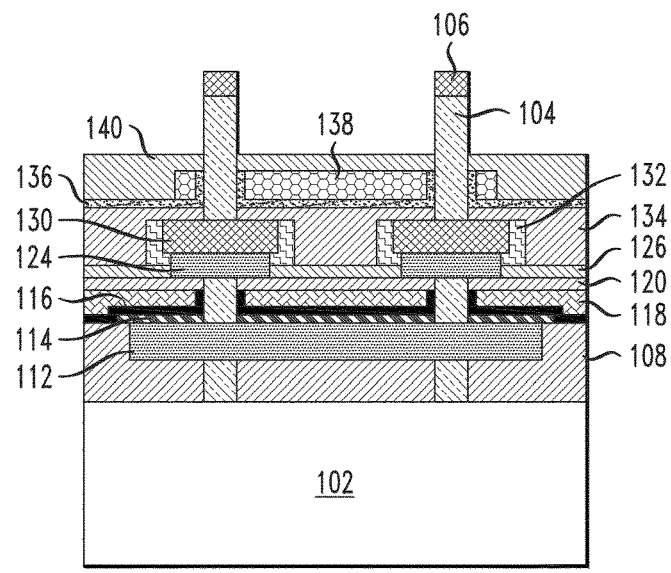
FIGS. 19A and 19B are cross-sectional and top views, respectively, after depositing a spacer layer, according to an embodiment of the invention.
Figure 19B:
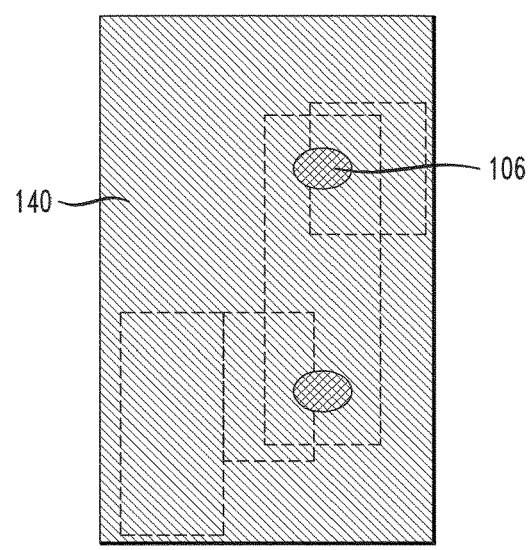

FIGS. 19A and 19B illustrate a cross-sectional view and a top view, respectively, of the next step of forming the top NFET transistor. In this illustrative embodiment, a second NFET spacer layer 140 is deposited over the top surfaces of gate dielectric layer 136 and metal gate layer 138. Second NFET spacer layer 140 can be formed in a similar manner and of similar material as first NFET spacer layer 134. The second NFET spacer layer 140 is then planarized and recessed as necessary.

Figure 20A:
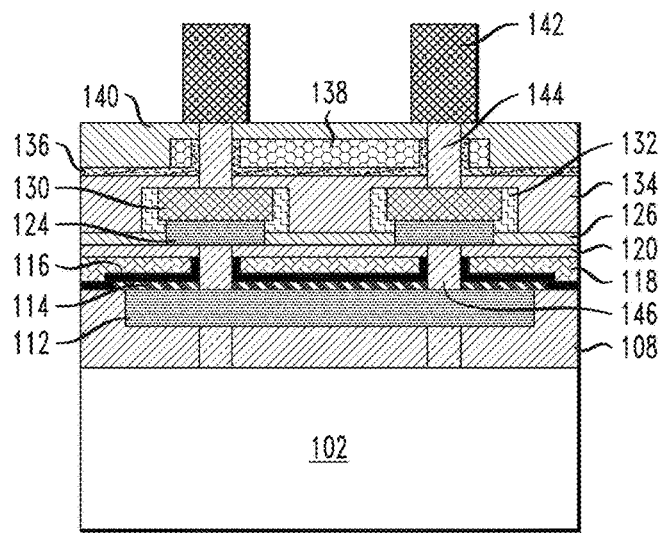
FIGS. 20A and 20B are cross-sectional and top views, respectively, after forming a NFET source region, according to an embodiment of the invention.
Figure 20B:
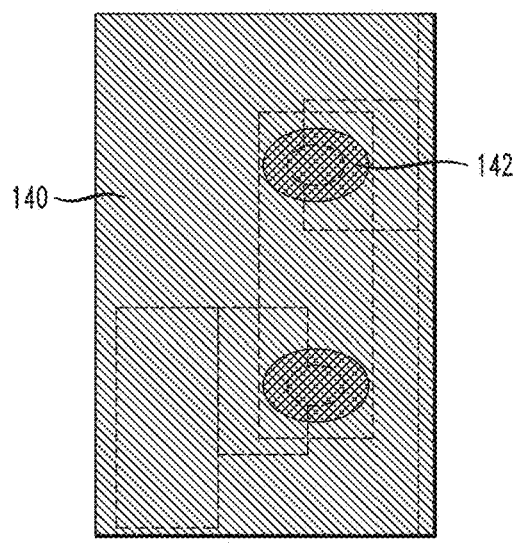

FIGS. 20A and 20B illustrate a cross-sectional view and a top view, respectively, of the next step of forming the top NFET transistor. In this illustrative embodiment, the NFET device is completed by forming a second source region 142 on semiconductor device 100. Source region 142 is formed by, for example, growing epitaxial semiconductor material on the top surface of second NFET spacer layer 140 and on exposed sidewall portions of nanowires 104 in a similar manner as source region 112 discussed above. In this exemplary embodiment, a semiconductor material suitable for the epitaxial growth of an NFET source is grown as further discussed above. Next, the epitaxial layer will be doped with a n-type dopant as also discussed above. In other embodiments, the semiconductor material may be doped with a p-type dopant. The portion of the semiconductor nanowire between the source region 142 and drain region 130 may be referred to herein as a NFET channel portion (or channel region) 144. Likewise, the portion of the semiconductor nanowire between the source region 141 and drain region 124 may be referred to herein as a PFET channel portion (or channel region) 146.

Figure 21A:
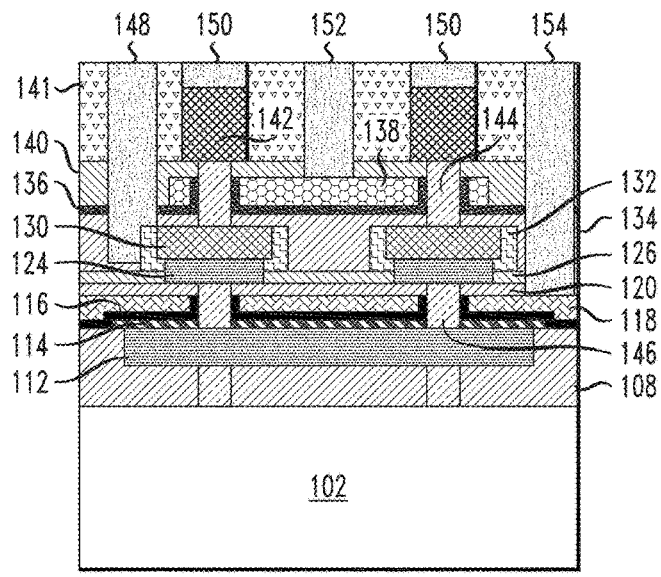
FIGS. 21A and 21B are cross-sectional and top views, respectively, after forming local wiring in between the stacked PFET source/drain region and NFET source/drain region, according to an embodiment of the invention.
Figure 21B:
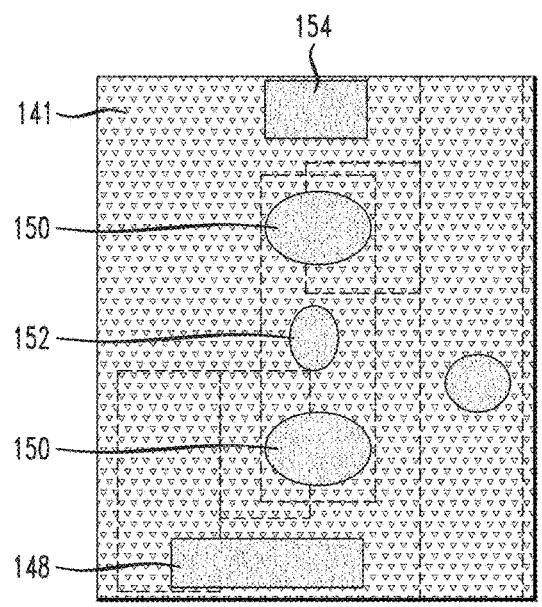

FIGS. 21A and 21B illustrate the completed vertically stacked semiconductor device 100 with metal contacts including vias 148, 152 and 154 and metal contact 150. In one illustrative embodiment, a conductive via 148 is formed as a communicative node. In one illustrative embodiment, a conductive via 150 communicative with the second source region 142 of the second FET device is formed. In one illustrative embodiment, a conductive via 152 communicative with the second gate structure of the second FET device is formed. In one illustrative embodiment, a conductive via 154 communicative with the first gate structure of the first FET device is formed. For example, conductive via 152 can be formed by first depositing a third insulator layer 141 on the second spacer layer 140 and over a top surface of the second source region 142. Third insulator layer 141 is formed in a similar manner and of similar material as second insulator layer 126 discussed above. Next, conductive via 152 is formed by selectively etching third insulator layer 141, and second spacer layer 140 such that the via is communicative with the second gate structure, i.e., metal gate 138 of the second FET device. A conductive material is then deposited within the via. Suitable conductive material includes, for example, cobalt, copper, nickel or tungsten. The depositing step may be followed by or accompanied with an annealing step. As one skilled in the art will readily appreciate, conductive vias 148, 150 and 154 can be formed in a similar manner as conductive via 152.

It is to be understood that the methods discussed herein for fabricating semiconductor structures can be incorporated within semiconductor processing flows for fabricating other types of semiconductor devices and integrated circuits with various analog and digital circuitry or mixed-signal circuitry. In particular, integrated circuit dies can be fabricated with various devices such as transistors, diodes, capacitors, inductors, etc. An integrated circuit in accordance with embodiments can be employed in applications, hardware, and/or electronic systems. Suitable hardware and systems for implementing embodiments of the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein.

Furthermore, various layers, regions, and/or structures described above may be implemented in integrated circuits (chips). The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Although illustrative embodiments have been described herein with reference to the accompanying drawings, it is to be understood that the invention is not limited to those precise embodiments, and that various other changes and modifications may be made by one skilled in art without departing from the scope or spirit of the invention.

What is claimed is:

1. A method for fabricating a semiconductor device, comprising:
    forming a first field effect transistor (FET) device on a semiconductor substrate, the FET device comprising a first source/drain layer, and a first gate structure comprising a gate dielectric layer and a metal gate layer, wherein forming the first FET device comprises:
    providing a plurality of nanowires extending from a surface of the semiconductor substrate, wherein a spacer is present on sidewall surfaces of each nanowire and a hard mask is present on a top surface of each nanowire; and a shallow trench isolation (STI) insulator deposited on the top surface of the semiconductor substrate;
    forming a first source region on the semiconductor substrate;
    removing the spacer from the sidewall surfaces of each nanowire;
    forming the first gate structure over the first source region;
    forming a first insulator layer over the first gate structure;
    forming a second spacer on the sidewall surfaces of each nanowire;
    recessing the first insulator layer and exposing a portion of the sidewall of each nanowire; and
    forming a first drain region on the recessed first insulator layer and on the exposed sidewall portions of each nanowire;
    forming a second FET device comprising a second source/drain layer, and a second gate structure comprising a gate dielectric layer and a metal gate layer; wherein the first and second FET devices are in a stacked configuration; and
    forming one or more conductive vias communicative with either the first gate structure of the first FET device or the second gate structure of the second FET device.

2. The method of claim 1, wherein the first FET device is a PFET device and the second FET device is a NFET device.

3. The method of claim 1, wherein forming the first source region comprises:
    recessing the STI insulator and exposing a portion of the sidewall of each nanowire;
    epitaxially growing the first source region on the recessed portion of the STI insulator and on the exposed sidewall portions of each nanowire; and
    doping the first source region with a dopant.

4. The method of claim 3, further comprising:
    growing an oxide film on at least a portion of a surface of the doped first source region.

5. The method of claim 1, wherein forming the first drain region on the recessed first insulator layer and on the exposed sidewall portions of each nanowire comprises:
    epitaxially growing the first drain region on the recessed first insulator layer and on the exposed sidewall portions of each nanowire; and
    doping the first drain region with a dopant.

6. The method of claim 1, wherein forming the second FET device comprises:
    forming a second drain region in contact with the first drain region;
    forming an interconnect metal layer on a portion of the recessed first insulator layer and in contact with the first and second drain regions;
    forming the second gate structure over the second drain region; and
    forming the second source region.

7. The method of claim 6, wherein forming the second drain region in contact with the first drain region comprises:
    removing the second spacers from the sidewall surfaces of each nanowire;
    forming a second insulator layer over the recessed first insulator layer and the first drain region;
    forming a third spacer on the sidewall surfaces of each nanowire;
    recessing the second insulator layer and exposing a portion of the sidewall of each nanowire;
    epitaxially growing the second drain region on at least a portion of the recessed second insulator layer and on the exposed sidewall portions of each nanowire; and
    doping the second drain region with a dopant.

8. The method of claim 7, wherein forming the second gate structure over the second drain region comprises:
    depositing the interconnect metal layer on the recessed second insulator layer and to the top surface of the second drain region;
    patterning the interconnect metal layer to provide for a device interconnect between each of the nanowires;
    forming a first spacer layer on the recessed second insulator layer and over the top surface of the second drain region and patterned conductive metal layer;
    forming the second gate structure over a top surface of the first spacer layer.

9. The method of claim 8, wherein forming the second source region comprises:
    forming a second spacer layer on a top surface of the second gate structure;
    epitaxially growing the second source region on at least a portion of the second spacer layer and on the exposed sidewall portions of each nanowire; and
    doping the second source region with a dopant.

10. The method of claim 9, wherein forming the conductive via communicative with the first gate structure of the first FET device and the second gate structure of the second FET device comprises:
    forming a third insulator layer on the second spacer layer and on a top surface of the second source region;
    etching the third insulator layer, second spacer layer and the first and second metal gate structures to form a via in the third insulator layer, second spacer layer and the first and second metal gate structure, and
    depositing a conductive material within the via.

11. The method of claim 5, wherein the dopant for doping the first source region and first drain region is a P-type dopant material.

12. The method of claim 9, wherein the dopant for doping the second source region and second drain region is a P-type dopant material.

13. The method of claim 1, wherein forming the conductive via communicative with the first gate structure of the first FET device and the second gate structure of the second FET device comprises:
   etching the first and second metal gate structures to form a via in the first and second metal gate structure, and depositing a conductive material within the via.

14. The method of claim 1, wherein the STI insulator is an oxide material.

\* \* \* \* \*